United States Patent [19]

Carpio

[11] Patent Number: 5,840,629
[45] Date of Patent: Nov. 24, 1998

[54] COPPER CHEMICAL MECHANICAL POLISHING SLURRY UTILIZING A CHROMATE OXIDANT

[75] Inventor: Ronald A. Carpio, Austin, Tex.

[73] Assignee: Sematech, Inc., Austin, Tex.

[21] Appl. No.: 572,082

[22] Filed: Dec. 14, 1995

[51] Int. Cl.[6] .......................... H01L 21/302; C09K 13/00
[52] U.S. Cl. ...................... 438/692; 438/693; 438/697; 438/754; 216/105; 252/79.1
[58] Field of Search .............................. 156/636.1, 645.1; 216/88, 89, 100, 102, 105, 106; 437/228; 252/79.1; 438/692, 693, 754, 697

[56] References Cited

U.S. PATENT DOCUMENTS

| | | | |
|---|---|---|---|
| 2,171,546 | 9/1939 | Kapper | 216/102 |
| 2,434,021 | 1/1948 | Thompson et al. | 252/79.1 |
| 2,939,772 | 6/1960 | Newman et al. | 216/102 |
| 3,351,555 | 11/1967 | Byers et al. | 216/106 |
| 3,442,810 | 5/1969 | Elbreder | 252/79.1 |
| 3,464,908 | 9/1969 | Donaldson | 204/195 |
| 3,498,823 | 3/1970 | Jones et al. | 216/106 |
| 3,964,956 | 6/1976 | Snyder | 156/345 |
| 4,022,625 | 5/1977 | Shelton | 51/309 |
| 4,070,193 | 1/1978 | Tucker | 216/106 |
| 4,138,228 | 2/1979 | Hartfelt et al. | 51/295 |
| 4,512,859 | 4/1985 | Inoue | 451/36 X |
| 4,600,469 | 7/1986 | Fusco et al. | 156/636.1 |
| 4,728,552 | 3/1988 | Jensen, Jr. | 451/527 X |
| 4,793,895 | 12/1988 | Kaanta et al. | 156/627 |
| 4,944,836 | 7/1990 | Beyer et al. | 156/645 |
| 4,956,313 | 9/1990 | Cote et al. | 216/89 |
| 4,959,113 | 9/1990 | Roberts | 156/636 |
| 4,988,369 | 1/1991 | Akay | 51/293 |
| 5,166,093 | 11/1992 | Grief | 437/173 |
| 5,203,883 | 4/1993 | Perry | 451/36 X |
| 5,209,816 | 5/1993 | Yu et al. | 156/636 |
| 5,225,034 | 7/1993 | Yu et al. | 156/636.1 |
| 5,234,470 | 8/1993 | Lynn et al. | 451/36 X |
| 5,340,370 | 8/1994 | Cadien et al. | 252/79.1 |
| 5,364,510 | 11/1994 | Carpio | 204/153.1 |
| 5,373,047 | 12/1994 | Schnelle | 451/36 X |
| 5,407,526 | 4/1995 | Danielson et al. | 156/636 |
| 5,449,313 | 9/1995 | Kordonsky et al. | 451/36 X |
| 5,472,370 | 12/1995 | Malshe et al. | 451/41 |
| 5,527,423 | 6/1996 | Neville et al. | 252/79.1 |
| 5,533,923 | 7/1996 | Shamouilian | 451/36 X |
| 5,578,362 | 11/1996 | Reinhardt et al. | 428/147 |

FOREIGN PATENT DOCUMENTS 49-045451B  12/1974  Japan .

OTHER PUBLICATIONS

Stern and Geary, "Electrochemical Polarization," *Journal of the Electrochemical Society*, 104(1):56–63, Jan. 1957.
Willard et al., "Modern Voltammetric Techniques, Voltammetry, Polargraphy, and Related Techniques," *Instrumental Methods of Analysis Fifth Edition*, D. Van Nostrad Company Publishers, 655–656, 1974.
"Electrochemical Series," CRC Handbook of Chemistry and Physics, 63rd Ed., pp. D–162–164, 1983.
van Zant, "Ammonium Persulfate as a Stripping and Cleaning Oxidant," *Semiconductor International*, pp. 109–111, Apr. 1984.
Croce et al., "Synthesis and Characterization of Highly Conducting Gel Electrolytes," *Electrochimica Acta*, 39(14):2187–2194, 1994.
Brusic et al., "Corrosion and protection of thin–line conductors in VLSI structures," *IBM J. Res. Develop.*, 37(2):173–188, Mar. 1993.
Carpio et al., "Initial study of copper CMP slurry chemistries," *Thin Solid Films*, 266:238–244, 1995.
Fury et al., "Chemical–Mechanical Planarization of Aluminum–Based Alloys for Multilevel Metallization," *MRS Bulletin*, pp. 61–64, Nov. 1995.
O'Mara, "Planarization by Chemical–Mechanical Polishing for Multilevel Metal Integrated Circuits," Omar & Associates, Palo Alto, California.
Wang et al., "Chemical–Mechanical Polishing of Dual Damascene Aluminum Interconnect Structures," *Semiconductor International*, pp. 117–122, Oct. 1995.
Farkas et al., "Oxidation and Etching of Tungsten in CMP Slurries," *Advanced Metallization for ULSI Applications in 1994*, Proceedings of the Conference held Oct. 4–6, 1994, in Austin, Texas, pp. 25–32.

*Primary Examiner*—R. Bruce Breneman
*Assistant Examiner*—Anita Alanko
*Attorney, Agent, or Firm*—Arnold, White & Durkee

[57] ABSTRACT

There is described a slurry for use in chemical mechanical polishing of copper layers in integrated circuit fabrication. The slurry includes a chromate oxidant, such as sodium chromate tetrahydrate ($Na_2CrO_4 \cdot 4H_2O$). The chromate oxidant provides a slightly basic slurry solution that enhances removal characteristics for copper layers. In one embodiment, the slurry has a pH between about 6 and about 9.

21 Claims, 2 Drawing Sheets

COPPER CHEMICAL MECHANICAL POLISHING SLURRY UTILIZING A CHROMATE OXIDANT

BACKGROUND OF THE INVENTION

The invention relates generally to semiconductor processing and, more particularly to a slurry having a chromate oxidant for use in chemical mechanical polishing of copper or copper alloys.

Metal films are used for a variety of purposes in the fabrication of integrated circuits. For example, it is well-known that metal films may be used to form interconnective lines, contacts and other conductive features on and above the surface of a semiconductor wafer.

In recent years, there has been a growing interest in the use of copper or copper alloys for metallization in integrated circuits. Copper has some characteristics that make it a particularly attractive candidate for metal features. In particular, copper has a lower resistivity than aluminum alloys, and copper is not as susceptible to electromigration as are aluminum alloys.

However, the widespread use of copper integrated circuit metal features has been limited thus far by the lack of a viable process for pattern definition. Conventional dry etch techniques that have been used to pattern other metal alloys are not as practical with copper, in part because of high temperature requirements. Selective deposition techniques have also been considered, but no practical processes have yet been fully developed.

Recently, it has been shown chemical mechanical polishing (CMP) techniques may be useful in patterning copper layers. For metal layers, CMP may be utilized in damascene (or inlaid metal) processes. As is known in the art, CMP is a semiconductor fabrication technique that uses a chemical slurry, along with a polishing pad, to "planarize," or remove discontinuities along the surface of an in-process semiconductor wafer. In CMP processing, mechanical movement of the pad relative to the wafer in the presence of an abrasive provides mechanical stress which is combined with a chemical process to selectively remove exposed portions of the exposed surface of the wafer. The slurry serves multiple roles; namely, it is the medium in which the abrasive particles is dispersed, and secondly it furnishes the chemical agents which promote the chemical process. In order for optimum results in CMP processing, there must be a synergistical relationship between the chemical and mechanical processes.

In the prior art, slurry compositions for copper CMP have principally employed nitric acid or ammonium hydroxide solutions. However, these solutions have limitations that are still being discovered. For example, some applications of copper CMP require that the slurry used have a high selectivity between the metal being polished and adjoining layers of silicon dioxide. Since highly basic solutions are known to achieve relatively fast removal rates in silicon dioxide etching, highly basic slurry solutions cannot be used to remove the copper without also removing the silicon dioxide. In highly acidic solutions (i.e., with low pH) such as nitric acid solutions, there is an imbalance of the chemical process relative to the mechanical process. Uncontrolled and unwanted dissolution of Cu occurs which results in dishing. Thus, there is a need for improvements in slurry formulations if Cu CMP processing is to become practical.

SUMMARY OF THE INVENTION

The present invention provides for the use of slurry formulations including a chromium (VI) oxidant. In one embodiment, the oxidation state of chromium is provided by dissolving chromate salt such as $Na_2CrO_4.4H_2O$ in purified (e.g., ultrapure deionized) water. The pH of the solution is then suitably adjusted by the addition of an acid such as sulfuric acid or chromic acid; alternatively a buffer solution can be utilized. The desirable pH range is approximately is approximately 6 to 9 so that the CMP process is a "passivation" type process. The Cu removal in a passivation process occurs by a combination of the chemical and mechanical processes, and it will not occur in areas where abrasion is not occurring since a surface oxide will be present which prevents the surface from undergoing solution etching; i.e., such areas are passivated. In those areas of the exposed Cu surface where abrasion is occurring, the abrasive action removes this protective oxide, exposing the pure metal surface to the oxidant which reoxidizes the surface. This process is repeated continuously with a net removal of metal which is undergoing polishing until a planar surface has been obtained. The use of Cr (IV) salts in the preparation of such slurries is advantageous in that these salts are oxidants which are effective at an elevated pH range. Other strong oxidants are generally only effective in highly acidic solutions (low pHs). However, it is preferable to avoid low pH solutions for Cu CMP processes, otherwise the process will be dissolution based rather than passivation based.

DETAILED DESCRIPTION AND SPECIFICATION

Figure 1:
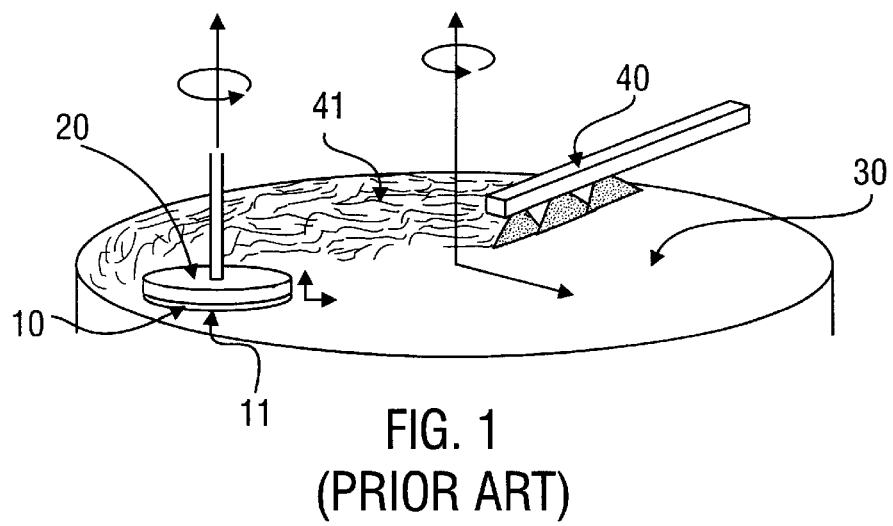
FIG. 1 shows a prior art set up of a tool for performing CMP processing.

FIG. 1 shows a typical set up of a tool for performing CMP processing. A wafer 10 (from which multiple semiconductor devices will be formed) is supported by a wafer carrier 20. The wafer 10 is placed face-down on a polishing pad 30 so that a surface 11, which is to be polished, rests against the surface of pad 30. Wafer carrier 20 is coupled to equipment that provides for the rotation and movement of wafer 10 relative to pad 30. Pad 30 may also be mounted as to rotate in operation. Slurry delivery system 40 allows slurry 41 to flow over the surface of pad 30 during the polishing operation. It will be appreciated that this general technique for CMP processing is known in the art.

Figure 2A:
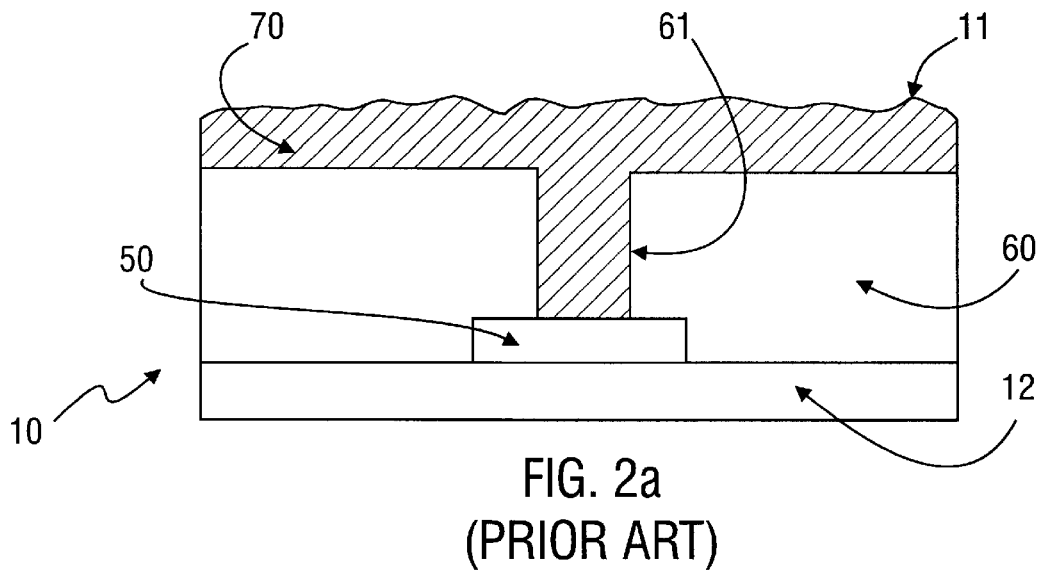
FIG. 2a shows an in-process wafer before CMP processing of a metal layer formed on the upper surface.
Figure 2B:
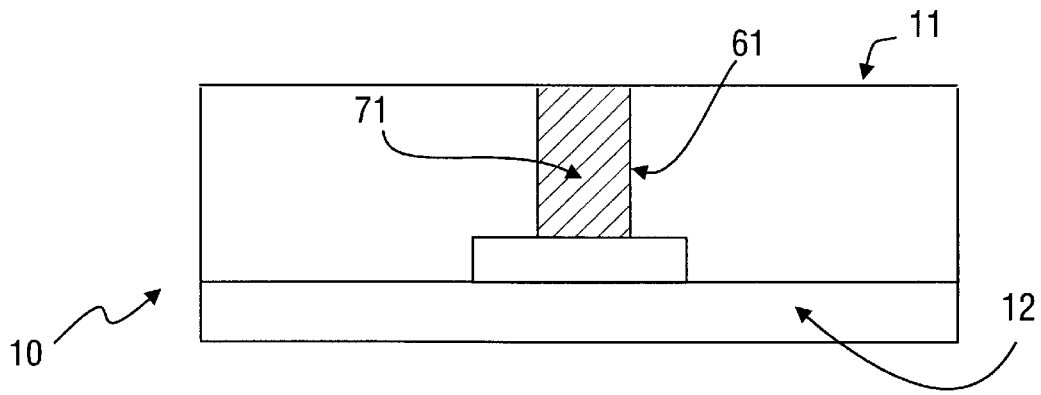
FIG. 2b shows an in-process wafer after CMP processing of a metal layer formed on the upper surface.

FIGS. 2a and 2b show a prior art use of CMP processing to form metal features on a semiconductor wafer. In FIG. 2a, an in-process semiconductor wafer 10 is shown with conductive region 50 disposed on a substrate 12. It will be appreciated that conductive region 50 could alternatively be inset into substrate 12 of the wafer 10, or may rest upon other intermediate layers not shown. A dielectric region 60 is shown with contact pattern 61 formed therein. Metal layer 70 is formed above the upper surface of dielectric region 60 and fills the contact pattern 61. The upper surface 11 of wafer 10 is generally non-planar before CMP processing.

FIG. 2b shows the result of CMP processing performed on equipment like that shown in FIG. 1. At the end of the CMP processing, the upper surface 11 of wafer 10 is generally planar. All that remains of metal layer 70 is a contact 71 formed in contact pattern 61. The technique illustrated in FIGS. 2a and 2b is a well-known application of metal CMP processing to form a metal contact for connecting two conductive regions separated by an insulator. It will be appreciated that there are other possible applications of metal CMP to integrated circuit fabrication.

The present invention provides a CMP slurry that is particularly useful in CMP processing of copper features. As used herein copper refers to both pure copper and copper alloys containing substantial quantities of copper. Generally, a slurry is an aqueous solution. According to the present invention the slurry may include a chromate salt. Furthermore, the slurry may include an additive for pH adjustment, a corrosion inhibitor (if desired) and a suitably dispersed abrasive. In an embodiment of the present invention, the oxidizing agent is an aqueous soluble chromate salt such as sodium chromate tetrahydrate ($Na_2CrO_4 \cdot 4H_2O$) which is available in an analytical grade from Mallinckrode, Paris, Ky.). However, any soluble chromate which can be obtained in a purified form such as potassium chromate will also be suitable. In addition, other co-oxidants could be added. But, co-oxidants have generally been found to be unnecessary. However, corrosion inhibitors such as benzotriazole, 6-tolyltriazole and 1-(2,3-dicarboxypropyl-) benzotriazole may have some beneficial effects and could also be added.

It should be noted that even though a chromate salt is utilized, the following reaction will occur

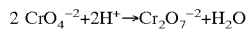

$$2\ CrO_4^{-2} + 2H^+ \rightarrow Cr_2O_7^{-2} + H_2O$$

and will lead to the formation of the dichromate anion which is even a more powerful oxidizing agent than the chromate anion. As shown, the extent of this reaction is controlled by the pH. Thus, the oxidizing strength of the slurry formulation will be pH dependent, and will increase with a decrease in pH. The oxidizing strength of the solution will in turn influence the CMP removal rate. It is desirable that the minimum pH is limited to approximately 6 to insure that passivation chemistry is attained. The use of a corrosion inhibitor is expected to allow the pH to be reduced below this limit and still insure that a minimum of dishing occurs. Another factor which should be considered in pH selection is the solubility of the reactants and products.

It is contemplated that the chromate oxidizing agent described herein will be used in solution to create a slurry for CMP processing. Typical slurry compositions contain the chromate oxidant present in the range of about 0.5 to 5% by weight. The composition will depend largely upon the CMP removal rate desired, the cost of the chromate salt, and the costs of slurry disposal or reclamation. The minimum concentration will, as a rule, be set by the reasons listed above as well as the need to reduce the level of residual contamination on processed wafers as well as in the fab itself.

Using the slurry compositions described herein, slightly basic solutions (pH less than about 9) can be prepared. More preferable pH levels include 6 to 9 and most preferable levels include 7 to 8.5. Such pH levels achieve a high oxide selectivity that is absent from the prior art described above. The slightly basic pH is also beneficial in that it is desirable to use a slurry chemistry containing an oxidation agent so that a passive oxide film, such as copper oxide, is formed on the metal surface being polished. This oxide film passivates the metal and reduces the rate of metal dissolution or prevents metal etching completely. The kinetics of the passivation oxidation are rapid. However, during polishing the passivation oxide is removed by abrasion during the CMP process. Thus, a slurry having a high selectivity to oxide, yet allowing the rapid formation of a passivation oxide is provided.

Figure 3:
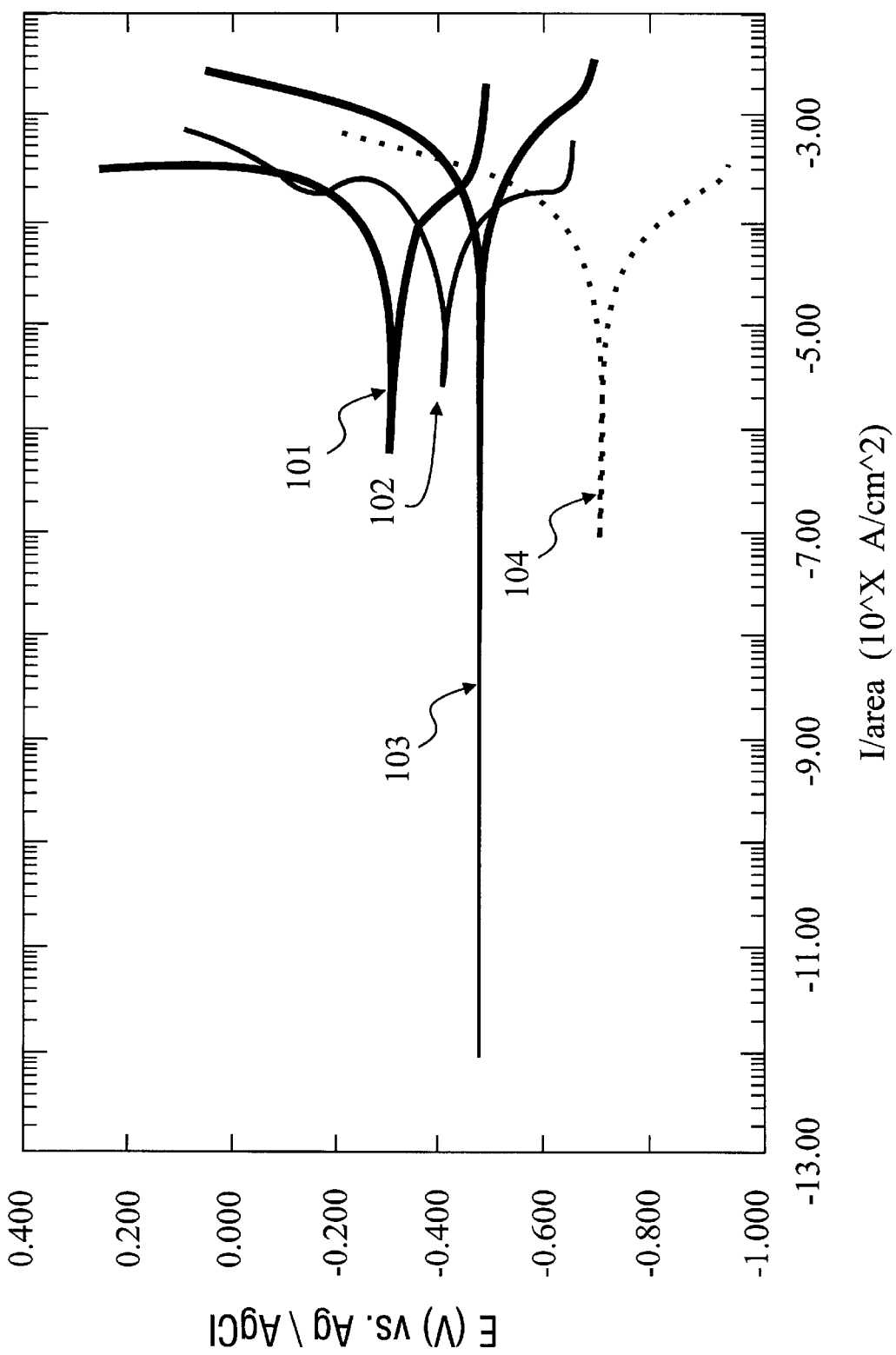
FIG. 3 shows potentiodynamic scans illustrating the beneficial results of the slurry of the present invention over those slurries used in the prior art.

FIG. 3 shows potentiodynamic scans with and without abrasion for copper in a 0.1 molar (M) sodium chromate solution with a pH of 8.62 which had been adjusted to this value by the addition of sulfuric acid and the scans with and without abrasion for a 1 wt % ammonium hydroxide solution. To simply this work, the abrasion was accomplished by the use of a rough pad, but could also have been achieved by the addition of abrasive particles such as $Al_2O_3$. Scan 101 corresponds to use of a chromate solution, without polishing. Scan 102 corresponds to use of a $NH_4OH$ solution, without polishing. Scan 103 corresponds to use of a chromate solution, with polishing. Scan 104 corresponds to use of a $NH_4OH$ solution, with polishing.

The utilization of potentiodynamic scans such as provided in FIG. 3 provide an electrochemical method for predicting the polishing results of a slurry. As shown in FIG. 3, each potentiodynamic scan 101, 102, 103, and 104 includes an anodic and cathodic curve. The scans can be characterized by identifying and comparing the relative corrosion current and the corrosion potential for each scan. The corrosion current can be identified as the point where the anodic and cathodic currents are equal in magnitude (as shown in FIG. 3, the approximate corrosion current is the point at which the currents first meet, for example approximately −4.4 for scan 103). The corrosion potential can be identified as the potential at the intersection point of the curves that form a scan. It has been found that the corrosion current correlates to the CMP removal rate. More particularly, as the value of the corrosion current decreases the CMP removal rate generally decreases. Furthermore, the corrosion potential indicates the amount of passivation film formed on the copper. A large offset between the corrosion currents and potentials for the with polish scan and the without polish scan is desirable. Further in the no polish case, it is desirable to have no corrosion (that is, no metal dissolution occurring).

It may be visually seen from FIG. 3 that with polishing the corrosion current is higher for chromate electrolyte (scan 103, approximately −4.4) than the ammonium hydroxide solution (scan 104, approximately −5.5). However, in the no polish scans (scans 101 and 102), the corrosion current is higher for the ammonium hydroxide solution (scan 102) than the chromate electrolyte (scan 101). Thus, the chromate solution provides better results compared to ammonium hydroxide in both the polish and no polish conditions because the CMP removal rate for the chromate solution is higher during polish yet lower in the no polish condition (i.e., no dissolution occurring in the no polish state).

As for the corrosion potential, it may be seen that the potential for a chromate solution with polishing (scan 103) is higher than the corrosion potential for the ammonium hydroxide with polishing (scan 104). Likewise the corrosion potential without polishing for the chromate solution (scan 101) is also higher than the ammonium hydroxide without polishing (scan 102). The higher corrosion potential in both cases for the chromate indicates less exposure of the bare metal surface. That is, the copper is more protected by a complete or partial passive film in the chromate solution than in the ammonium hydroxide solution. In summary, the potentiodynamic curves indicate that the chromate solution provides more desirable passivation characteristics and more desirable CMP removal rate characteristics compared to the ammonium hydroxide solution.

While the compositions and methods of this invention have been described in terms of preferred embodiments, it will be apparent to those of skill in the art that variations may be applied to the compositions and methods described herein without departing from the concept, spirit and scope of the invention. All such similar substitutes and modifications apparent to those skilled in the art are deemed to be within the spirit, scope and concept of the invention as defined by the appended claims.

I claim:

1. A copper polishing slurry for use in chemical mechanical polishing of a copper layer formed atop a semiconductor wafer, said copper polishing slurry comprising a chromate salt, wherein said slurry is for use in chemical mechanical polishing of a copper layer, wherein said slurry allows rapid formation of a passive oxide film on said copper layer which reduces or prevents dissolution or etching of said copper, and wherein said slurry allows said passive oxide film to be removed when said passive oxide film is subjected to abrasive action.

2. The slurry of claim 1, wherein said salt is sodium chromate tetrahydrate ($Na_2CrO_4 \cdot 4H_2O$).

3. The slurry of claim 2 wherein a concentration of said sodium chromate tetrahydrate is equal to or less than about 5% by weight.

4. The slurry of claim 3 wherein said concentration is between about 0.5% and about 5% by weight.

5. The slurry of claim 1 wherein said salt is an aqueous soluble chromate.

6. The slurry of claim 1 wherein said slurry has a minimum pH of about 6.

7. The slurry of claim 6, further comprising sulfuric acid or chromic acid.

8. The slurry of claim 6 wherein said slurry has a pH of between about 7 and about 8.5.

9. A slurry for use in chemical mechanical polishing of a metal layer formed on a semiconductor wafer, said slurry comprising a chromate oxidant wherein said slurry has a pH of between about 6 and about 9, wherein said slurry allows rapid formation of a passive oxide film on said metal layer which reduces or prevents dissolution or etching of said metal, and wherein said slurry allows said passive oxide film to be removed when said passive oxide film is subjected to abrasive action.

10. The slurry of claim 9 wherein said chromate oxidant is sodium chromate tetrahydrate ($Na_2CrO_4 \cdot 4H_2O$).

11. The slurry of claim 10, said slurry being for use in chemical mechanical polishing of a copper layer.

12. The slurry of claim 10 wherein a concentration of said sodium chromate tetrahydrate is equal to or less than about 5% by weight.

13. The slurry of claim 12 wherein said concentration is between about 0.5% and about 5% by weight.

14. The slurry of claim 10, further comprising sulfuric acid or chromic acid.

15. The slurry of claim 10 wherein said slurry has a pH of between about 7 and about 8.5.

16. A method for forming a metal feature on a semiconductor wafer, said method comprising:

forming a metal layer atop an upper surface of said wafer; and chemical mechanical polishing said metal layer using a slurry comprising a chromate oxidant and having a pH of between about 6 and about 9, wherein said slurry allows rapid formation of a passive oxide film on said metal layer which reduces or prevents dissolution or etching of said metal, and wherein said slurry allows said passive oxide film to be removed when said passive oxide film is subjected to abrasive action.

17. The method of claim 16 wherein said chromate oxidant comprises sodium chromate tetrahydrate ($Na_2CrO_4 \cdot 4H_2O$).

18. The method of claim 17 wherein said sodium chromate tetrahydrate is present in a concentration of about 0.5 to 5.0% by weight.

19. The method of claim 16 wherein said metal layer comprises copper.

20. The method of claim 19 wherein said chromate oxidant comprises sodium chromate tetrahydrate ($Na_2CrO_4 \cdot 4H_2O$).

21. The slurry of claim 1, wherein said slurry further comprised abrasive particles.

* * * * *